(12) United States Patent
Iwamoto

(10) Patent No.: US 7,999,632 B2
(45) Date of Patent: Aug. 16, 2011

(54) BRANCHING FILTER AND METHOD FOR MANUFACTURING THE SAME

(75) Inventor: Takashi Iwamoto, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 87 days.

(21) Appl. No.: 12/546,880

(22) Filed: Aug. 25, 2009

(65) Prior Publication Data
US 2009/0309673 A1    Dec. 17, 2009

Related U.S. Application Data

(63) Continuation of application No. PCT/JP2008/050819, filed on Jan. 22, 2008.

(30) Foreign Application Priority Data

Feb. 28, 2007    (JP) .................................. 2007-050106

(51) Int. Cl.
*H03H 9/72*    (2006.01)
*H03H 3/08*    (2006.01)
*H03H 9/64*    (2006.01)

(52) U.S. Cl. ...... 333/133; 333/193; 29/25.35; 310/313 B

(58) Field of Classification Search .................. 333/133, 333/193–196; 310/313 B; 29/25.35
See application file for complete search history.

(56) References Cited

U.S. PATENT DOCUMENTS

| | | | |
|---|---|---|---|
| 7,151,424 B2 * | 12/2006 | Kando | 333/193 |
| 2002/0000895 A1 | 1/2002 | Takahashi et al. | |
| 2002/0089393 A1 | 7/2002 | Tikka et al. | |
| 2003/0076194 A1 | 4/2003 | Machui | |
| 2003/0132817 A1 | 7/2003 | Nagai | |
| 2004/0145278 A1 * | 7/2004 | Iwamoto | 310/348 |
| 2005/0264375 A1 | 12/2005 | Ikuta et al. | |
| 2006/0138902 A1 * | 6/2006 | Kando | 310/313 D |

FOREIGN PATENT DOCUMENTS

| JP | 8-195645 A | 7/1996 |
|---|---|---|
| JP | 8-213874 A | 8/1996 |
| JP | 11-26623 A | 1/1999 |

(Continued)

OTHER PUBLICATIONS

English language machine translation of JP 2005-252335, published Sep. 15, 2005.*

(Continued)

*Primary Examiner* — Barbara Summons
(74) *Attorney, Agent, or Firm* — Keating & Bennett, LLP

(57) ABSTRACT

A branching filter that is capable of being reduced in size, particularly in height, has a configuration in which a transmitting filter chip and a receiving filter chip include a first piezoelectric substrate and a second piezoelectric substrate, respectively, and are spaced from each other. The transmitting filter chip includes a first insulating layer which extends over an IDT or which is disposed above the IDT. The receiving filter chip includes a first insulating layer which extends over an IDT or which is disposed above the IDT. The upper surfaces of the transmitting and receiving filter chips and are covered with a second insulating layer. External terminals arranged on the upper surface of a third insulating layer are electrically connected to the IDTs and through conductors and extending through the first insulating layers and the second insulating layer and the conductors, and include plating films.

9 Claims, 9 Drawing Sheets

FOREIGN PATENT DOCUMENTS

| | | |
|---|---|---|
| JP | 2001-185976 A | 7/2001 |
| JP | 2003-37471 A | 2/2003 |
| JP | 2005-252335 A | 9/2005 |
| JP | 2006-14296 A | 1/2006 |
| JP | 2006-246538 A | 9/2006 |
| JP | 2007-28195 A | 2/2007 |

OTHER PUBLICATIONS

English language machine translation of JP 2001-185976, published Jul. 6, 2001.*

Official Communication issued in International Patent Application No. PCT/JP2008/050819, mailed on May 13, 2008.

* cited by examiner

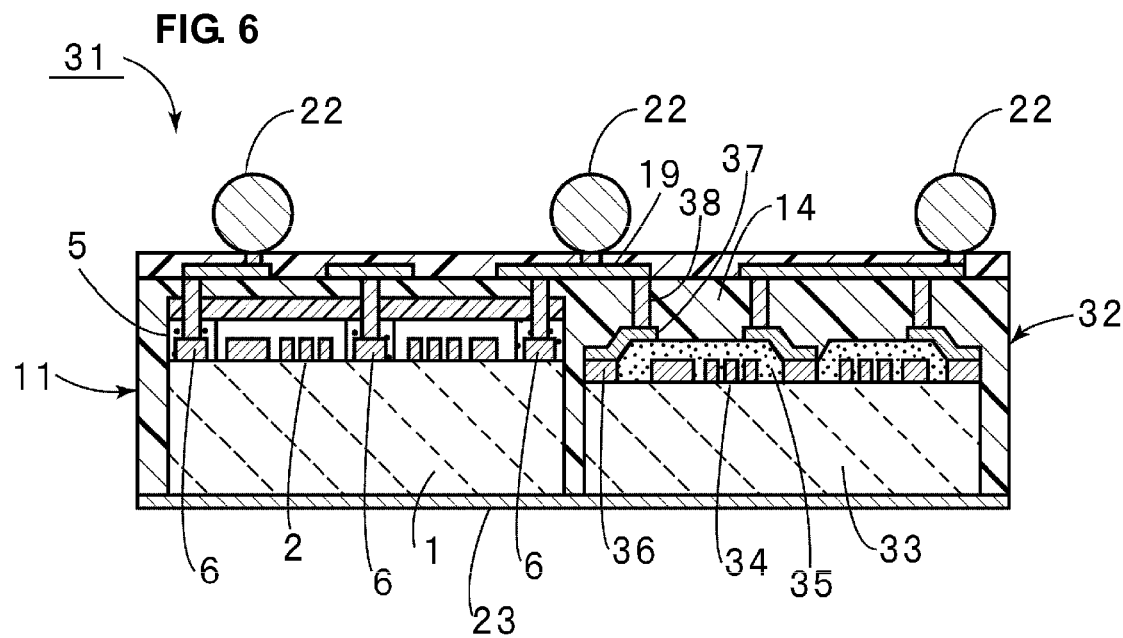
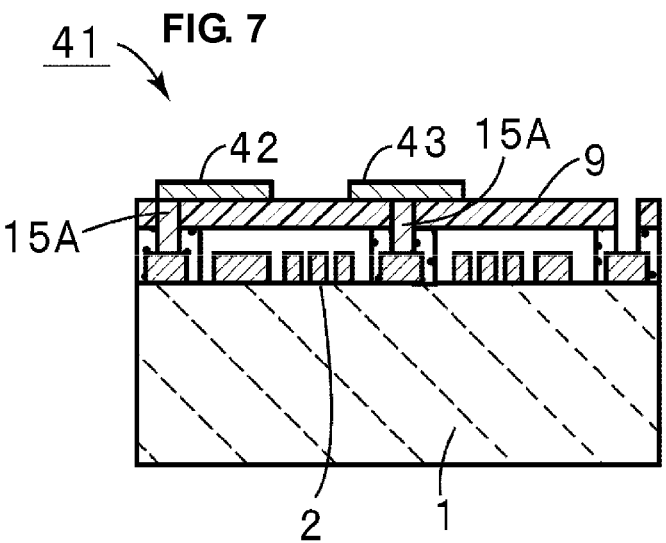

BRANCHING FILTER AND METHOD FOR MANUFACTURING THE SAME

BACKGROUND OF THE INVENTION

1. Field of the Invention

The present invention relates to branching filters including transmitting filter chips and receiving filter chips, and more particularly, to a branching filter including a receiving filter chip and a transmitting filter chip defined by acoustic wave chips and a method for manufacturing the branching filter.

2. Description of the Related Art

For mobile communication devices, such as mobile phones, various branching filters including receiving bandpass filters and transmitting bandpass filters have been proposed. For example, Japanese Unexamined Patent Application Publication No. 2003-517239 discloses a branching filter including a receiving bandpass filter and a transmitting bandpass filter each including a surface acoustic wave filter. In Japanese Unexamined Patent Application Publication No. 2003-517239, the surface acoustic wave filters, which are included in the receiving and transmitting bandpass filters, are disposed on a common piezoelectric substrate. Since the receiving and transmitting bandpass filters are disposed on the common piezoelectric substrate, the branching filter has a relatively small size.

However, receiving bandpass filters and transmitting bandpass filters have different pass bands from each other and therefore have different requirements from each other. Therefore, Japanese Unexamined Patent Application Publication No. 2003-517239 further discloses a structure in which a surface acoustic wave filter included in a transmitting bandpass filter and a surface acoustic wave filter included in a transmitting bandpass filter are disposed on different piezoelectric substrates.

On the other hand, Japanese Unexamined Patent Application Publication No. 11-26623 discloses a structure in which a first surface acoustic wave filter chip defining a transmitting bandpass filter and a second surface acoustic wave filter chip defining a receiving bandpass filter are mounted on a mounting board by a face-down process. FIG. 11 is a schematic front sectional view of a branching filter 501, disclosed in Japanese Unexamined Patent Application Publication No. 2003-517239, including a mounting board 502. The mounting board 502 supports a first surface acoustic wave filter chip 503 and second surface acoustic wave filter chip 504 mounted thereon with a plurality of metal bumps 505 and a plurality of metal bumps 506, respectively, by a face-down technique. The first surface acoustic wave filter chip 503 is overlaid with a heat-dissipating member 507. The upper surface of the heat-dissipating member 507 is in contact with a shielding member 508 made of metal.

In the branching filter 501, the first surface acoustic wave filter chip 503 is different from the second surface acoustic wave filter chip 504. A piezoelectric substrate included in the first surface acoustic wave filter chip 503 and a piezoelectric substrate included in the second surface acoustic wave filter chip 504 can be selected depending on required frequency characteristics.

In the branching filter 501, an electrode including an IDT is disposed under the lower surfaces of the piezoelectric substrates, which are included in the surface acoustic wave filter chips 503 and 504. The electrode faces a space defined by the thickness metal bumps 505 and 506. Therefore, surface acoustic waves are not prevented from being excited.

Japanese Unexamined Patent Application Publication No. 2003-37471 discloses an example of a surface acoustic wave device, different from a branching filter, having a space provided so as not to prevent the excitation of surface acoustic waves. FIG. 12 shows a surface acoustic wave device disclosed in Japanese Unexamined Patent Application Publication No. 2003-517239 in front sectional view. The surface acoustic wave device 521 includes a surface acoustic wave element 524 including a piezoelectric substrate 522 and an electrode including IDTs 523 arranged on the lower surface of the piezoelectric substrate 522. The surface acoustic wave element 524 is bonded to a resin substrate 525 with a cured thermosetting resin 526a and a cured photocurable resin 526b such that the IDTs 523 are arranged on the lower surface thereof. After the lower surface of the surface acoustic wave element 524 and the upper surface of the resin substrate 525 are coated with an uncured thermosetting resin composition and an uncured photocurable resin composition and then attached to each other as shown in FIG. 12, the compositions are cured by applying heat and light thereto. This allows the surface acoustic wave element 524 and the resin substrate 525 to be bonded to each other with the cured products 526a and the 526b. A space A corresponding to the thickness of the cured products 526a and the 526b is present therebetween.

Japanese Unexamined Patent Application Publication No. 2003-517239 discloses a branching filter including a transmitting bandpass filter and receiving bandpass filter that are individually formed. Since the transmitting and receiving bandpass filters are individually formed as surface acoustic wave filter element chips, there is a problem in that the branching filter has a large size.

In the branching filter 501 disclosed in Japanese Unexamined Patent Application Publication No. 11-26623, the first and second surface acoustic wave filter chips 503 and 504 are mounted above the mounting board 502 by the face-down process. Therefore, the size of the branching filter 501 can be reduced.

In the branching filter 501, the first and second surface acoustic wave filter chips 503 and 504, which include the different piezoelectric substrates, are spaced from each other at a predetermined distance as shown in FIG. 11. The first and second surface acoustic wave filter chips 503 and 504 are mounted above the mounting board 502 with the metal bumps 505 and 506. Therefore, the areas of the piezoelectric substrates, which define the first and second surface acoustic wave filter chips 503 and 504, are relatively large. Therefore, an area of the branching filter 501 is relatively large.

Since the space can be formed depending on the height of the metal bumps 505 and 506, the branching filter 501 can be manufactured so as to have a reduced height. However, the height reduction thereof is limited because the metal bumps 505 and 506 have a relatively large height.

In the surface acoustic wave device 521 disclosed in Japanese Unexamined Patent Application Publication No. 2003-37471, the surface acoustic wave element 524 is bonded to the resin substrate 525 with the cured products 526a and 526b and the space A corresponding to the thickness of the cured products 526a and the 526b is present therebetween. Thus, the surface acoustic wave device 521 has a reduced height. However, the surface acoustic wave device 521 includes the surface acoustic wave element 524, in which the IDTs 523 are arranged on the single piezoelectric substrate. Therefore, a branching filter that includes a transmitting bandpass filter including the surface acoustic wave device 521 and a receiving bandpass filter including a similar surface acoustic wave device including another piezoelectric substrate cannot avoid having a relatively large size.

Recently, various boundary acoustic wave filter devices including IDTs disposed between piezoelectric substances and insulating substances have been proposed. The boundary acoustic wave filter devices do not require any space for not preventing vibration and therefore can have a reduced height. However, the boundary acoustic wave filter devices are disadvantageously inferior to surface acoustic wave filter devices in terms of power resistance. Therefore, although the boundary acoustic wave filter devices can be used for receiving bandpass filters for branching filters, surface acoustic wave filter devices are required to be used for transmitting bandpass filters. If a boundary acoustic wave filter device is used in a filter element chip included in a branching filter, the degree of height reduction is limited.

SUMMARY OF THE INVENTION

To overcome the problems described above, preferred embodiments of the present invention provide a branching filter which includes a receiving bandpass filter and a transmitting bandpass filter including different acoustic wave filter chips which have a size, particularly a height, that is reduced, and also provide a method for manufacturing the branching filter.

A preferred embodiment of the present invention provides a branching filter including a receiving filter chip and a transmitting filter chip. The transmitting filter chip is an acoustic wave filter chip. The receiving filter chip is an acoustic wave filter chip. The transmitting filter chip includes a first piezoelectric substrate, at least one IDT disposed on the upper surface of the first piezoelectric substrate, and a first insulating layer which extends over the IDT or which is disposed above the IDT. The receiving filter chip includes a second piezoelectric substrate, at least one IDT disposed on the upper surface of the second piezoelectric substrate, and a first insulating layer which extends over the IDT or which is disposed above the IDT. The transmitting and receiving filter chips are arranged such that the upper surfaces of the first and second piezoelectric substrates face upward. Each of the transmitting and receiving filter chips includes a second insulating layer disposed on a corresponding one of the first insulating layers, at least one third insulating layer disposed on the upper surface of the second insulating layer, an external terminal which is disposed on the upper surface of the third insulating layer and which is to be externally electrically connected, and a conductor which has one end connected to the external terminal and another end electrically connected to the IDT and which extends in the first and second insulating layers. The conductor has a portion which extends in the first and second insulating layers and is made of metal primarily including a plating film.

In the branching filter, the second insulating layer of the transmitting filter chip and the second insulating layer of the receiving filter chip are preferably connected to each other, such that the transmitting and receiving filter chips are unified. Since the transmitting and receiving filter chips are unified by the second insulating layers, the size of the branching filter can be reduced.

In the branching filter, the second insulating layers preferably extend on side surfaces of the transmitting and receiving filter chips and the lower surfaces of the second insulating layers are preferably flush or substantially flush with the lower surfaces of the first and second piezoelectric substrates, which are included in the transmitting and receiving filter chips. Therefore, after the transmitting and receiving filter chips and the second insulating layers are formed, the lower surfaces thereof can preferably be polished. In the transmitting and receiving filter chips, surface and/or boundary acoustic waves propagate near the upper surfaces of the first and second piezoelectric substrates. Although polishing is preferably performed as described above, the branching filter is not significantly deteriorated and has desired properties and a reduced thickness.

The branching filter preferably further includes inductor conductors disposed in portions in which the second insulating layers and the third insulating layers are stacked, so as to provide inductance components. The use of the inductance components defined by the inductor conductors enables differences in properties to be further reduced as compared to the use of external inductor components.

In the branching filter, the receiving or transmitting filter chip is preferably a surface acoustic wave filter chip and further preferably includes a support layer which is disposed on the first piezoelectric substrate and which extends around a region including the IDT and the first insulating layer is preferably disposed on the upper surface of the support layer such that a space which allows for vibration is provided. Therefore, the space does not prevent vibration when the IDT of the receiving filter chip is excited.

In the branching filter, the receiving or transmitting filter chip is preferably a boundary acoustic wave filter chip and the first insulating layer preferably extend above the second piezoelectric substrate so as to cover the IDT. In this case, the size of the receiving filter chip can be reduced and the shock resistance thereof can be improved.

In the branching filter, the plating film is preferably made of at least one selected from the group consisting of Cu, Ni, and an alloy primarily including these metals, for example. This increases the bonding strength between the plating film and a conductive portion electrically connected to the plating film.

The branching filter preferably further includes a protective layer extending over the lower surfaces of the first and second piezoelectric substrates. This reduces the mechanical shock caused during mounting. A marking layer can preferably be formed on the protective layer with a laser or other suitable method.

In the branching filter, the protective layer preferably extends over the lower surfaces of the second insulating layers. This reduces the shock caused during mounting and allows the lower surfaces thereof to be readily marked with a laser or other suitable method.

A method for manufacturing branching filters according to a preferred embodiment of the present invention includes a step of preparing transmitting filter chips and receiving filter chips, the transmitting filter chips each including a first piezoelectric substrate, at least one IDT disposed on the upper surface of the first piezoelectric substrate, and a first insulating layer which extends over the IDT or which is disposed above the IDT, the receiving filter chips each including a second piezoelectric substrate, at least one IDT disposed on the upper surface of the second piezoelectric substrate, and a first insulating layer which extends over the IDT or which is disposed above the IDT, a step of preparing a carrier substrate, a step of pairing the transmitting filter chips with the receiving filter chips and arranging pairs of the transmitting and receiving filter chips on the carrier substrate in a grid pattern such that the lower surfaces of the first and second piezoelectric substrates are applied to the carrier substrate, a step of forming a second insulating layer over the upper surfaces of the transmitting and receiving filter chips, a step of forming a plurality of through-holes in the second insulating layer, a step of forming plating films made of metal in the through-holes preferably by electroplating, for example, a step of forming a wiring pattern primarily including a plating film on the upper surface of the second insulating layer preferably by electroplating, for example, a step of forming a third insulating layer on the upper surface of the second insulating layer, a step of forming a plurality of through-holes in the third insulating layer, a step of forming via-hole conductors such that plating films are formed in the through-holes in the third insulating layer preferably by electroplating, for example, a step of forming external terminals on the third insulating layer such that the external terminals are connected to the via-hole conductors, a step of dividing the transmitting filter chip-receiving filter chip pairs into the branching filters, and a step of removing the transmitting filter chip-receiving filter chip pairs from the carrier substrate.

A branching filter according to a preferred embodiment of the present invention includes a receiving filter chip and transmitting filter chip that are separately provided. A first piezoelectric substrate and second piezoelectric substrate having desired properties can be used to define the receiving filter chip and the transmitting filter chip, respectively. The transmitting and receiving filter chips are overlaid with first, second, and third insulating layer. Conductors electrically connecting external terminals arranged on the third insulating layer to IDTs of the transmitting and receiving filter chips have portions which extend in the first and second insulating layers and which include strong plating films. The conductors, which include the plating films, are tough and therefore can be reduced in size and/or height. This allows the distance between the transmitting and receiving filter chips and the external terminals to be reduced. Therefore, the branching filter can be reduced in size, particularly height.

A method for manufacturing branching filters according to a preferred embodiment of the present invention includes a step of pairing transmitting filter chips with receiving filter chips and arranging pairs of the transmitting and receiving filter chips on the carrier substrate in a grid pattern, a step of forming a second insulating layer such that the transmitting and receiving filter chips are unified, a step of forming conductor portions in the first and second insulating layers from plating films, and a step of dividing the transmitting filter chip-receiving filter chip pairs into the branching filters. Therefore, the branching filters can be readily and efficiently manufactured.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 6 is a schematic front sectional view of a branching filter according to a modification of the first preferred embodiment of the present invention.

FIG. 7 is a schematic front sectional view of a transmitting filter chip prepared in a second preferred embodiment of the present invention.

DETAILED DESCRIPTION OF THE PREFERRED EMBODIMENTS

Preferred embodiments of the present invention will now be described with reference to the accompanying drawings.

A method for manufacturing branching filters according to a preferred embodiment of the present invention and a branching filter will now be described in detail with reference to FIGS. 1A to 1G and 2 to 4.

Figure 1A:
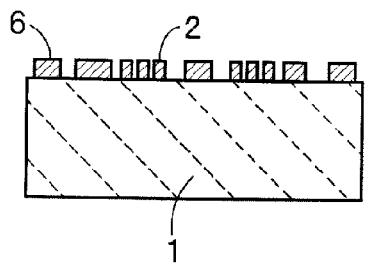
FIGS. 1A to 1G are schematic front sectional views illustrating steps a method for manufacturing branching filters according to a first preferred embodiment of the present invention.

As shown in FIG. 1A, an electrode pattern including IDTs 2 and electrode pads 6 are formed on a first piezoelectric substrate 1 for forming a transmitting filter chip. In this preferred embodiment, the first piezoelectric substrate 1 preferably is a $LiTaO_3$ substrate. The first piezoelectric substrate 1 may be a single-crystalline piezoelectric substrate or a piezoelectric ceramic substrate, for example.

Figure 1B:
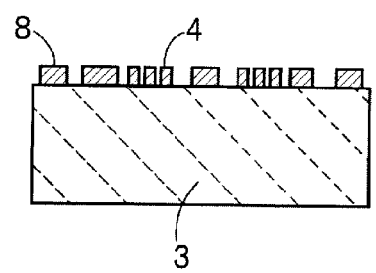

As shown in FIG. 1B, an electrode pattern including IDTs 4 and electrode pads 8 are formed on a second piezoelectric substrate 3 for forming a receiving filter chip. In this preferred embodiment, the second piezoelectric substrate 3 preferably is a $LiTaO_3$ substrate. The second piezoelectric substrate 3 may be a single-crystalline piezoelectric substrate or a piezoelectric ceramic substrate, for example.

The electrode patterns, which include the IDTs 2 and 4, can be formed by an appropriate process such as photolithography. A material for forming the electrode patterns, which include the IDTs 2 and 4, is not particularly limited and may be a metal material such as Al, Cu, or an alloy primarily containing these metals. Each electrode patterns may be composed of stacked metal layers.

Figure 1C:
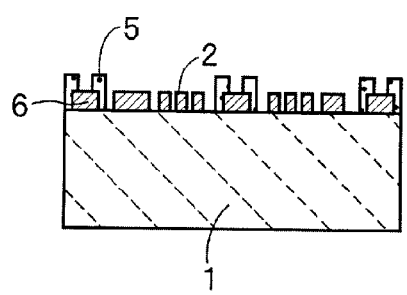

As shown in FIG. 1C, a space-forming support layer is formed on the upper surface of the first piezoelectric substrate 1. In this preferred embodiment, the space-forming support layer 5 is formed from a photosensitive resin by photolithography and patterning. That is, a photosensitive epoxy resin composition is applied to the first piezoelectric substrate 1, exposed, developed, and then cured, whereby the photosensitive resin is patterned. This allows the space-forming support layer 5 to be formed such that the electrode pads 6 and surface acoustic wave-exciting portions including the IDTs 2 are partly uncovered. The electrode pads 6 are portions of the electrode pattern including the IDTs 2 and are electrically connected to the IDTs 2.

In this preferred embodiment, the space-forming support layer 5 is formed from the photosensitive epoxy resin composition by photolithography and patterning as described above and may be formed from another resin material.

Figure 1D:
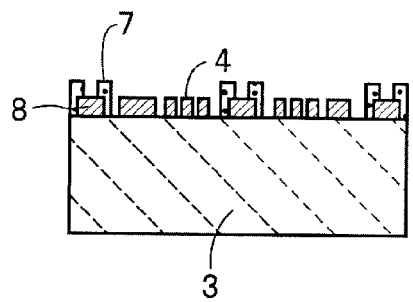

As shown in FIG. 1D, a space-forming support layer 7 is formed on the upper surface of the second piezoelectric substrate 3 in the same manner as above. The space-forming support layer 7 is formed by patterning such that the IDTs 4 and the electrode pads 8 are partly uncovered. The electrode pads 8 are electrically connected to the IDTs 4.

Protective insulating layers with a thickness of several tens of nanometers may be formed on the electrode patterns, which include the IDTs 2 and 4, by sputtering as required. Examples of a material for forming the protective insulating layers include $SiO_2$, SiN, and diamond-like carbon. In the case where the protective insulating layers are formed, openings need to be formed in the protective insulating layers by dry etching such that the upper surfaces of the electrode pads 6 and 8 are exposed through the openings. This allows exposed portions of the electrode pads 6 and 8 to be externally electrically connected after the space-forming support layers 5 and 7 are formed.

Figure 1E:
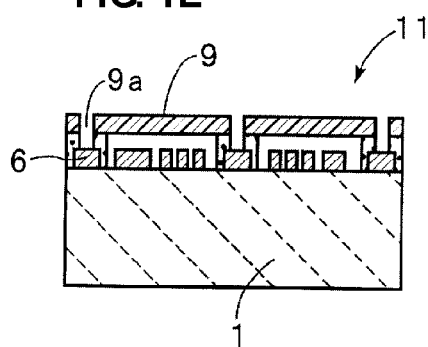

As shown in FIG. 1E, a first insulating layer 9 is formed. In this preferred embodiment, the first insulating layer 9 is formed in such a manner that a photosensitive epoxy resin composition sheet is stacked on the upper surface of the space-forming support layer 5 by a roll-laminating process, exposed, developed, and then cured. The first insulating layer 9 is patterned such that the upper surfaces of the electrode pads 6 are partly uncovered as shown in FIG. 1E. In other words, the first insulating layer 9 has openings 9a through which the electrode pads 6 are partly exposed.

Another photosensitive resin composition sheet may be used instead of the photosensitive epoxy resin composition sheet. A procedure for forming the first insulating layer 9 is not limited to the manner that the photosensitive epoxy resin composition sheet is deposited on the upper surface of the space-forming support layer 5 by the roll-laminating process, exposed, developed, and then cured. The first insulating layer 9 may be formed by any of various patterning processes.

Figure 1F:
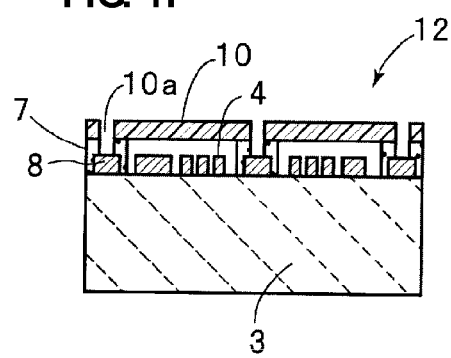

As shown in FIG. 1F, a first insulating layer 10 is formed above the second piezoelectric substrate 3 in the same manner as above. The first insulating layer 10 has openings 10a through which the electrode pads 8 are exposed.

The following chips are obtained as described above: each transmitting filter chip 11 shown in FIG. 1E and each receiving filter chip 12 shown in FIG. 1F. The transmitting filter chip 11 and the receiving filter chip 12 are completed by forming second and third insulating layers as described below. For simple description, the transmitting filter chip 11 and the receiving filter chip 12 are used to describe structures including no second or third insulating layer.

A procedure for fabricating each of the transmitting filter chips 11 and the receiving filter chips 12 is as described above with reference to FIGS. 1A to 1F. In actual, a large number of the transmitting filter chips 11 and the receiving filter chips 12 may be fabricated in such a manner that a large-area piezoelectric wafer for producing first or second piezoelectric substrates are processed as described above and then diced.

Figure 1G:
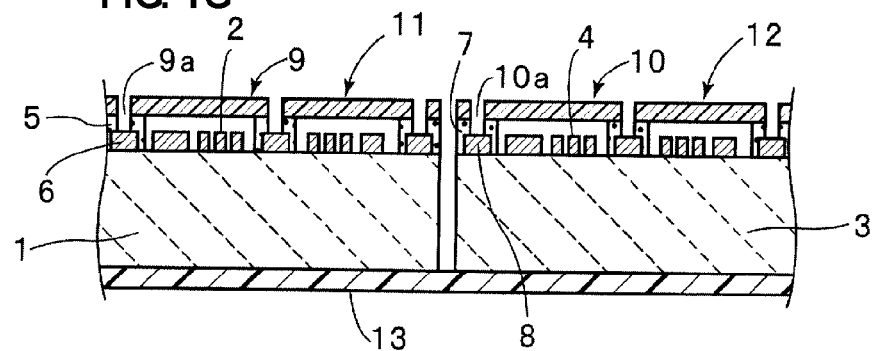

The transmitting filter chips 11 are paired with the respective receiving filter chips 12. As shown in FIG. 1G, pairs of the transmitting and receiving filter chips 11 and 12 are temporarily fixed on a carrier substrate 13 so as to form a matrix pattern.

The carrier substrate 13 may be a substrate made of an appropriate resin such as a glass epoxy resin or an epoxy resin or a substrate made of a ceramic material such as alumina.

After a layer of a temporary adhesive is provided on the carrier substrate 13, the transmitting and receiving filter chips 11 and 12 are applied to the carrier substrate 13 and are temporarily fixed thereon. The temporary adhesive layer is not particularly limited and is an alcohol-soluble wax layer in this preferred embodiment.

A layer of a releasable adhesive may be used instead of the alcohol-soluble wax layer. The temporary adhesive may be any material which can be readily released from the carrier substrate 13 and which forms protective layers when being applied to the lower surfaces of the transmitting and receiving filter chips 11 and 12. This allows the temporary adhesive to be used to form the protective layers.

Figure 2A:
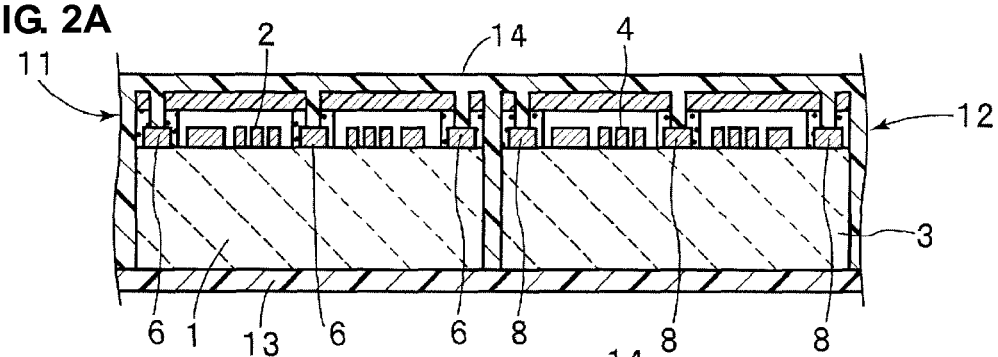
FIGS. 2A to 2D are schematic front sectional views illustrating steps of the method according to the first preferred embodiment of the present invention.

As shown in FIG. 2A, a second insulating layer 14 is formed over the upper surfaces of the transmitting and receiving filter chips 11 and 12. In this preferred embodiment, the second insulating layer 14 is formed from a photosensitive epoxy resin composition by printing in such a manner that a metal mask is placed above the upper surface of the carrier substrate 13. That is, the second insulating layer 14 is formed over a pair of filter chip structures including the transmitting and receiving filter chips 11 and 12. In this step, the second insulating layer 14 is unexposed and extends over not only the upper surfaces of the transmitting and receiving filter chips 11 and 12 but also side surfaces thereof.

The second insulating layer 14 may be formed so as to cover the upper surfaces of the transmitting and receiving filter chips 11 and 12. That is, the second insulating layer 14 need not be necessarily formed such that the transmitting filter chips 11 are integrated with the receiving filter chips 12. The second insulating layer 14 need not extend to side surfaces of either the transmitting filter chips 11 or the receiving filter chips 12.

Alternatively, after a resin layer is formed over side surfaces of the transmitting and receiving filter chips 11 and 12, the second insulating layer may be formed over the upper surfaces of the transmitting and receiving filter chips 11 and 12.

In this preferred embodiment, the second insulating layer 14 is preferably formed over the upper surfaces of the transmitting and receiving filter chips 11 and 12 and all the side surfaces thereof. This allows the transmitting and receiving filter chips 11 and 12 to have high moisture resistance and mechanical shock resistance.

Figure 2B:
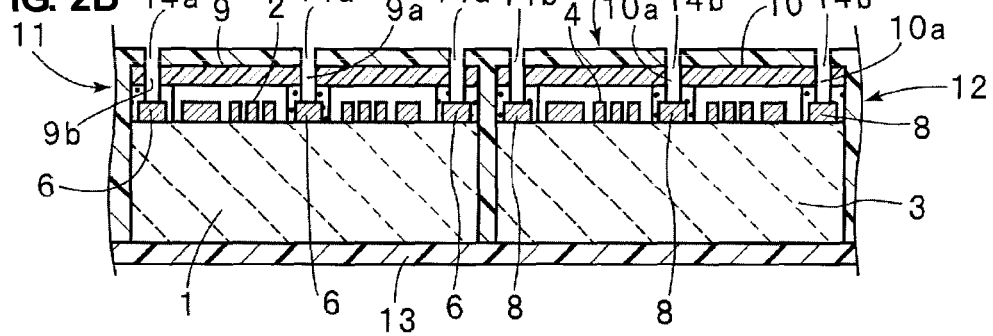

The second insulating layer 14, which is made of the photosensitive epoxy resin composition, is exposed and then developed, whereby a plurality of openings 14a and 14b are formed as shown in FIG. 2B. The openings 14a are disposed in the transmitting filter chips 11 and the openings 14b are disposed in the receiving filter chips 12.

The openings 14a overlap with the openings 9a located thereunder. The openings 14b overlap with the openings 10a, which are arranged in the first insulating layer 10. The upper surfaces of the electrode pads 6 and 8 are partly exposed through the openings 14a and 14b.

The second insulating layer 14 is patterned and then cured as described above.

A Cu film and then a Ti film are formed over the upper surface of the second insulating layer 14 by sputtering. The thickness of the Cu film may be about 0.3 μm and the thickness of the Ti film may be about 0.05 μm, for example.

The openings 14a and 14b are filled with conductors 15 and 16 by electroplating in such a manner that the stacked Cu and Ti films are used as a feeder. That is, the via-hole conductors 15 are formed in the openings 14a so as to be electrically connected to the electrode pads 6 and the via-hole conductors 16 are formed in the openings 14b so as to be electrically connected to the electrode pads 8. A metal material used for via-filling electroplating is Cu. Therefore, the via-hole conductors 15 and 16 are formed from a Cu plating film, that is, a metal plating film.

Figure 2C:
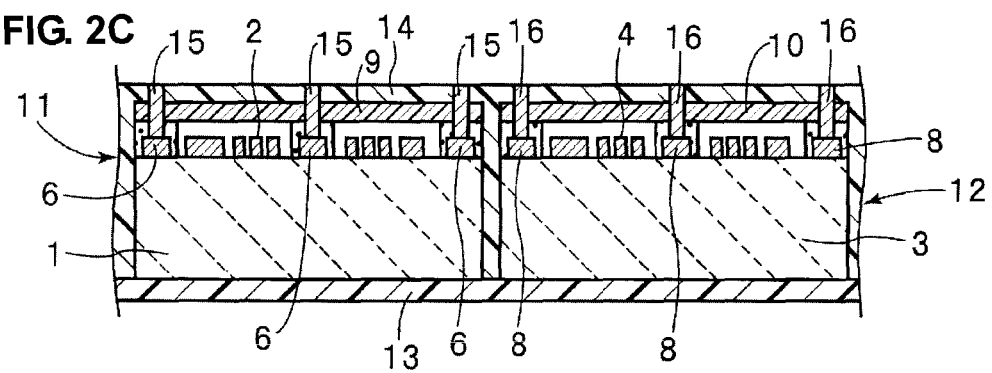

The Cu and Ti films, which are formed in advance of the formation of the conductors 15 and 16, are not shown in FIG. 2C.

Figure 2D:
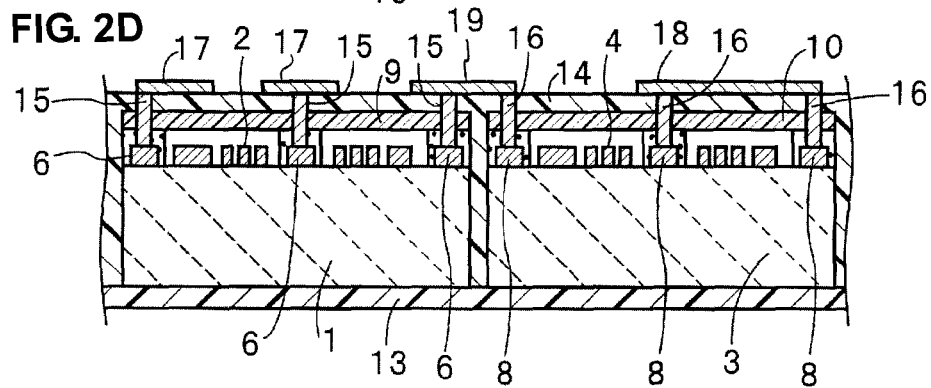

As shown in FIG. 2D, external terminals 17, external terminals 18, and external terminals 19 are formed on the second insulating layer 14 so as to be electrically connected to the via-hole conductors 15, the via-hole conductors 16, and both the via-hole conductors 15 and 16, respectively. A wiring layer, which is not shown, is formed together with the external terminals 17 to 19 in this step. The external terminals 17 to 19 and the wiring layer can be formed in such a manner that a layer of an appropriate metal material is formed and then patterned. Alternatively, the external terminals 17 to 19 and the wiring layer may be formed in such a manner that an appropriate metal material is printed using a mask or the like. In this preferred embodiment, a resist pattern having apertures for forming the external terminals 17 to 19 and the wiring layer is formed, metal films are formed by a vapor deposition process, and Cu films are then deposited on the deposited films, whereby the external terminals 17 to 19 and the wiring layer are formed.

The resist pattern is removed, whereby a structure shown in FIG. 2D is obtained.

Inductor conductors described below may be formed in this step in addition to the external terminals 17 to 19 and the wiring layer.

Figure 3A:
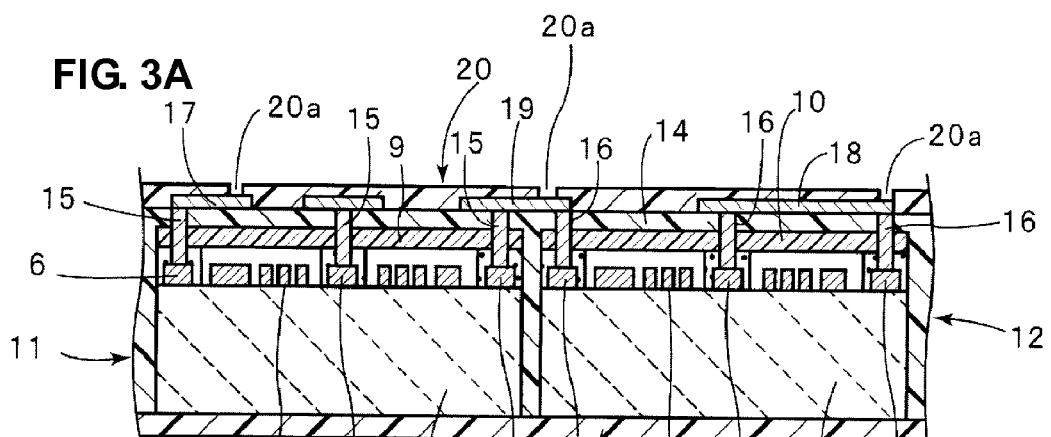
FIGS. 3A to 3C are schematic front sectional views illustrating steps of the method according to the first preferred embodiment of the present invention.

An epoxy resin-based solder resist is provided on the second insulating layer 14 so as to cover the external terminals 17 to 19 and the wiring layer. The resist is exposed in such a manner that portions to be opened are shielded from light. The resulting resist is developed and then cured, whereby a third insulating layer 20 having openings 20a is formed as shown in FIG. 3A. As described above, the third insulating layer 20 is formed by curing the epoxy resin-based solder resist resin composition. The third insulating layer 20 may be formed from a patternable photosensitive resin composition.

The openings 20a are arranged such that the external terminals 17 to 19 are partly exposed therethrough.

Figure 3B:
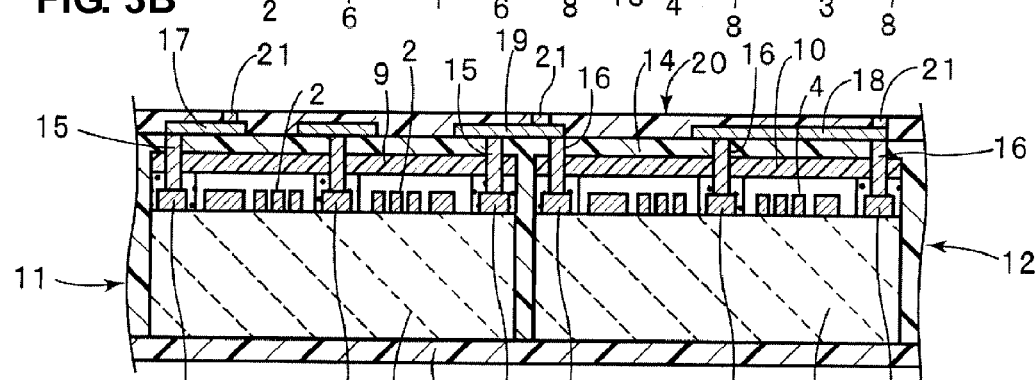

Metal films are formed in the openings 20a by electroplating such that the openings 20a are filled therewith. This allows under-bump metal layers 21 to be formed as shown in FIG. 3B. The under-bump metal layers 21 are formed such that the openings 20a are filled therewith.

A material for forming the under-bump metal layers 21 is not particularly limited. In this preferred embodiment, the under-bump metal layers 21 are formed in such a manner that Ni sublayers and Au sublayers are formed by electroplating in that order.

Figure 3C:
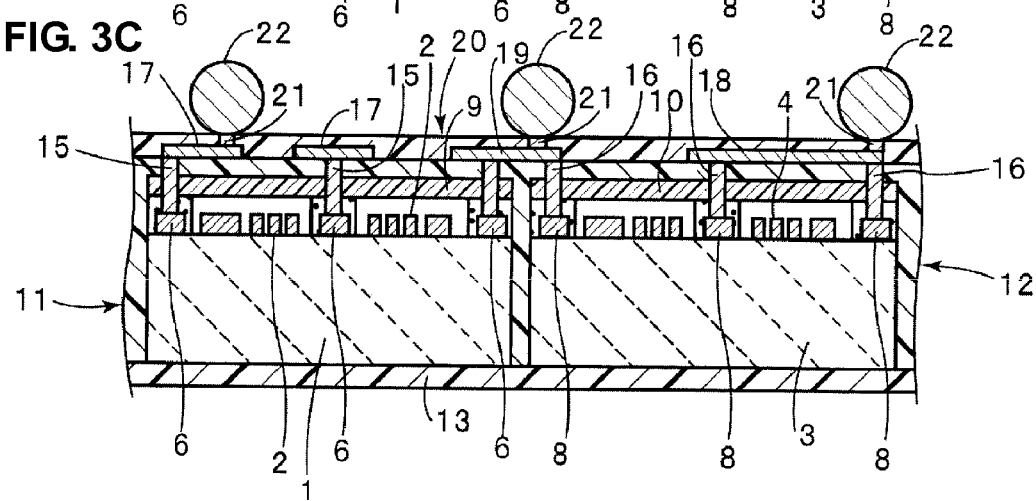

As shown in FIG. 3C, solder balls 22 are formed in such a manner that a solder paste is printed using a metal mask, reflow-heated, and then flux-cleaned. The solder balls 22 are used as external terminals for mounting the branching filters of this preferred embodiment on mounting boards.

Each branching filter including a pair of filter chips including the transmitting and receiving filter chips 11 and 12 is removed from the carrier substrate 13. The lower surfaces of the first and second piezoelectric substrates 1 and 3 are polished and the lower ends of portions of the second insulating layer 14 that extend on side surfaces of the transmitting and receiving filter chips 11 and 12 are polished. This allows the lower surfaces of the first and second piezoelectric substrates 1 and 2 to be flush with the lower surface of the second insulating layer 14. Polishing thereof allows the thickness of the first and second piezoelectric substrates 1 and 2 to be adjusted to a desired value. This leads to a reduction in branching filter height.

A structure for scattering acoustic waves may be formed over the lower surfaces of the first and second piezoelectric substrates 1 and 2.

Figure 4A:
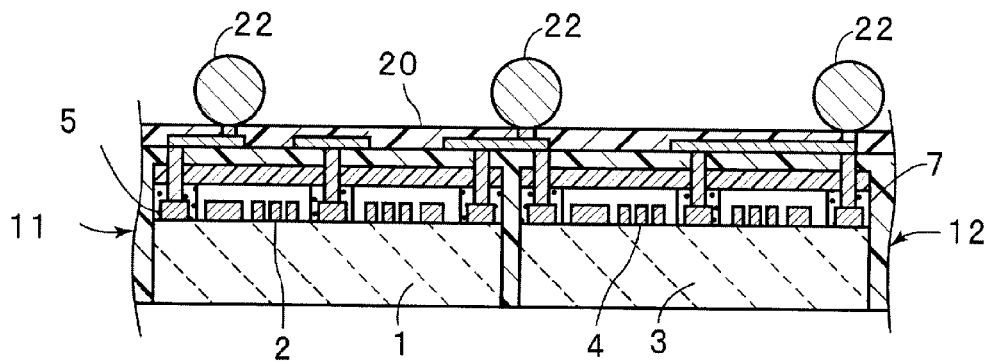
FIGS. 4A and 4B are schematic front sectional views illustrating steps of the method according to the first preferred embodiment of the present invention.
Figure 4B:
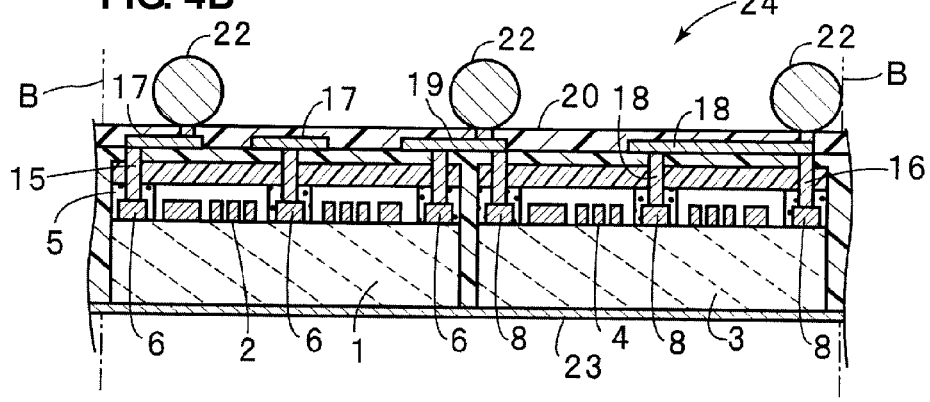

As shown in FIG. 4B, a protective layer 23 for the enhancement of shock resistance is formed over the lower surfaces of the branching filters 24. A material for forming the protective layer 23 may be an appropriate synthetic resin material such as an epoxy resin-based material. A mark showing a product type may be formed on the protective layer by laser marking or the like.

The protective layer 24 may be made of the temporary adhesive, which is used to temporarily fix the transmitting and receiving filter chips 11 and 12 to the carrier substrate 13 as described above.

In this case, the protective layer 24 may be formed in such a manner that after the branching filters are removed from the carrier substrate 13, the temporary adhesive is prepared from a photocurable or thermosetting resin composition that can be cured by light or heat, respectively, and then finally cured.

Figure 5:
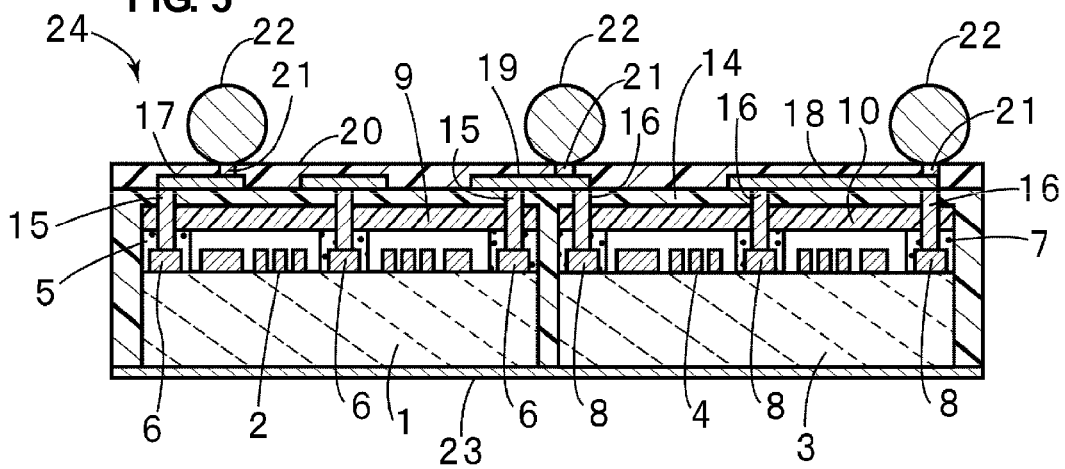
FIG. 5 is a front sectional view of a branching filter obtained in the first preferred embodiment of the present invention.

The second insulating layer 14 is diced along dotted-chain lines B defining the branching filters, whereby each branching filter 24 is obtained as shown in FIG. 5.

In the branching filter 24, the transmitting filter chip 11 and receiving filter chip 12, which each include a surface acoustic wave element chip, have spaces B and conductors for externally electrically connecting the IDTs 2 and 4 are the via-hole conductors, which are formed using the metal plating film and which extend through the first and second insulating layers. That is, the via-hole conductors are arranged in a stack of the first and second insulating layers and are electrically connected to the solder balls 22 defining external terminals. This allows an internal electric wiring portion present in a duplexer to have a reduced thickness, that is, this allows the duplexer to be reduced in size, particularly height. In surface acoustic wave filter chips, surface acoustic waves propagate along surfaces of piezoelectric substrates with energy concentrated on the surfaces thereof. Therefore, the piezoelectric substrates 1 and 3 need not have a large thickness. However, when the piezoelectric substrates do not have a certain thickness, the piezoelectric substrates are difficult to handle and are possibly damaged during manufacture.

In this preferred embodiment, after assembling is performed in such a state that the carrier substrate 13 is used for backing, the carrier substrate 13 is removed in such a stage that the second insulating layer 14 is used for the enhancement of strength. Polishing is then performed as described above. Since polishing is performed subsequently to the enhancement of mechanical strength, the first and second piezoelectric substrates 1 and 3 may have a reduced thickness. This leads to a reduction in height.

Among the conductors, conductive portions extending through the first and second insulating layers 9, 10, and 14, that is, the conductors 15 and 16 are formed using the metal plating film; hence, the bonding strength between the conductors and the electrode pads 6 and 8 or wiring patterns located thereabove is effectively enhanced. The metal plating film, which is formed by electroplating, is grown in such a manner that charges are exchanged between under-metals, such as the electrode pads 6, defining feeders and plating metal deposits on the electrode pads 6. Therefore, there is substantially no difference in crystal structure between inner portions of the metal plating film and interface portions of the metal plating film that are bonded to the electrode pads 6 and the metal plating film is unified with the electrode pads 6; hence, the bonding strength therebetween is high.

Au bumps and/or Al bumps are bonded by solid-phase diffusion bonding using ultrasonic waves. Because solid-phase diffusion bonding is performed in such a manner that oxide layers are forcedly broken with the ultrasonic waves, the crystal structure of the interface opts to be broken. Therefore, there is a problem that the bonding strength therebetween is insufficient because regions in which metal atoms contained in the bumps and those contained in electrode pads are diffused each other are narrow.

In contrast, the metal plating film is grown in such a manner that charges are exchanged between under-metals, such as electrode pads, defining feeders and a metal deposited on the metals. Therefore, there is substantially no difference in crystal structure between inner portions of the metal plating film and interface portions of the metal plating film and the metal plating film is unified with the metals; hence, the bonding strength therebetween is effectively enhanced.

A metal for forming the metal plating film is not particularly limited and may be any metal such as Ni, Cu, or Al or an alloy thereof. A hard metal plating film is preferably used.

Ni and Cu, which are used to form hard metal plating films, are harder and mechanically stronger than solder. The melting point of solder is low. In addition, Ni and Cu have high heat resistance because Ni and Cu are higher in melting point than solder and therefore are not significantly softened by heat applied thereto in a subsequent step.

The hard metal plating film is harder than solder and has a Brinell hardness of 28 kgf/mm$^2$ or more. A metal material for forming such a metal plating film is Al, Cu, or an alloy primarily containing these metals.

Solder, which is a low-melting point material containing Sn or In, is soft and is readily broken by applied stress. Soldered portions need to have a large size or height such that the stress applied thereto is reduced. Therefore, solder is unsuitable for size or height reduction. On the other hand, the hard metal plating film is harder than solder and is not significantly broken by applied stress. Therefore, junctions between the hard metal plating film and the electrode pads 6 or the wiring patterns are also not significantly broken by applied stress.

In each branching filter 24 of this preferred embodiment, the receiving filter chip 12 is in the form of a surface acoustic wave filter element. One or both of the receiving filter chip and the transmitting bandpass filter of the branching filter may be in the form of a surface acoustic wave filter element chip. FIG. 6 is a schematic front sectional view of a branching filter 31 according to a modification of this preferred embodiment. The branching filter 31 of the modification includes a transmitting filter chip 11 having substantially the same configuration as that of the transmitting filter chip 11 of this preferred embodiment. The difference therebetween is that a receiving filter chip 32 is in the form of a boundary acoustic wave filter element chip. The receiving filter chip 32 includes a second piezoelectric substrate 33, an electrode pattern including IDTs 34 disposed on the upper surface of the second piezoelectric substrate 33, and a first insulating layer 35 extending over the IDTs 34. A boundary acoustic wave propagating along the interface between the first insulating layer 35 and the second piezoelectric substrate 33 is used. Since such a boundary acoustic wave is used, any space for not preventing vibration need not be formed. This leads to a reduction in height.

The transmitting filter chip 11 may be made of a boundary acoustic wave filter chip. In this case, the first insulating layer of the transmitting filter chip, as well as the first insulating layer 35, extends over IDTs. This leads to a further reduction in height.

Electrode pads 36 are formed together with the IDTs 34. The electrode pads 36 are connected to wiring electrodes 37 extending on the upper surface of the first insulating layer 35.

In the modification, the first insulating layer 35, which extends over the IDTs 34, defines an insulator for forming an interface with a piezoelectric substance of a boundary acoustic wave device. A second insulating layer 14 extends over the first insulating layer 35 to the transmitting filter chip.

In this preferred embodiment, the second insulating layer 14 has a portion which is located in the receiving filter chip and which has a thickness greater than that of the transmitting filter chip.

In the modification, after a layer of the same material as that for forming the second insulating layer 14 is formed on the receiving filter chip 32 so as to have a thickness equal to the thickness of the transmitting filter chip 11, the second insulating layer 14 may be formed over the transmitting filter chip and the receiving filter chip.

In this preferred embodiment, the upper surfaces of the connection lines 37 are partly uncovered and the electrode pads 36 are electrically connected to electrodes 19 through the connection lines 37 and conductors 38.

The electrode pads 36, as well as the electrode pads 8 (FIG. 1D), are connected to the IDTs 34.

The duplexer 31 of the modification, as well as the duplexer 24 of this preferred embodiment, can be reduced in size and height. In the modification, the height can be reduced in such a manner that the lower surfaces of the first and second piezoelectric substrates 1 and 33 are polished in advance of the formation of a protective layer 23. Since polishing is performed as described above, the lower surfaces of the first and second piezoelectric substrates 1 and 33 and the lower surface of the second insulating layer 14 are flush with each other.

In the case where the receiving filter chip is formed in the form of a boundary acoustic wave filter element chip, an insulating material for forming the first insulating layer 35 is not particularly limited. In the modification, the first insulating layer 35 is formed in such a manner that a SiO$_2$ layer is formed and then patterned.

A manufacturing method according to a second preferred embodiment of the present invention will now be described with reference to FIGS. 7 to 10.

FIG. 7 is a schematic front sectional view of a transmitting filter chip prepared in the second preferred embodiment. In the second preferred embodiment, the transmitting filter chip 41 includes inductance-forming wiring patterns 42 and 43 disposed on a first insulating layer 9. After an electrode pattern including IDT electrodes 2 and electrode pads 6 is formed on a first piezoelectric substrate 1, a support layer 7 is formed. After through-holes are formed in the support layer 7, the first insulating layer 9 is formed. Openings are formed in the first insulating layer 9 so as to extend to the through-holes in the support layer. Metal plating films are formed in the openings, whereby conductors 15A are formed. The conductors 15A have lower end portions electrically connected to the electrode pads 6 and extend to the upper surface of the first insulating layer 9.

The inductance-forming wiring patterns 42 and 43 are formed on the transmitting filter chip side.

Figure 8A:
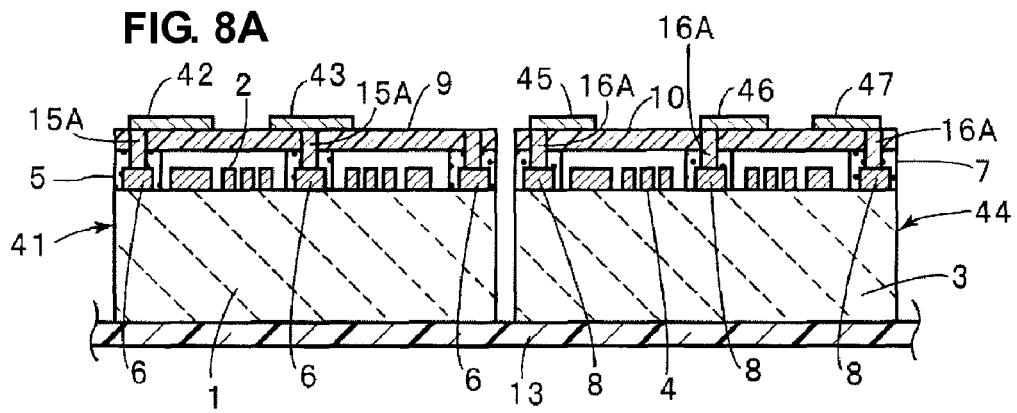
FIGS. 8A to 8C are schematic front sectional views illustrating steps of a method for manufacturing branching filters according to the second preferred embodiment of the present invention.

In a receiving filter chip, conductors 16A and inductance-forming wiring patterns 45 to 47 are formed as shown in FIG. 8A.

As shown in FIG. 8A, the transmitting filter chip 41, which includes the inductance-forming wiring patterns 42 and 43, is temporarily fixed on a carrier substrate 13. The receiving filter chip 44 includes the inductance-forming wiring patterns 45 to 47. The inductance-forming wiring patterns 42, 43, and 45 to 47 are formed in such a manner that, for example, a layer of an appropriate metal such as Cu, Al, Ni, or an alloy thereof is patterned into coils. The patterns may have a shape other than a coil shape depending on desired inductance. The patterns may have an appropriate shape such as a meander shape or a linear shape.

The inductance-forming wiring patterns 42 and 43 are electrically connected to the electrode pads 6, that is, electrically connected to the IDTs 2. The inductance-forming wiring patterns 45 to 47 are electrically connected to electrode pads 8 and IDTs 4.

Figure 8B:
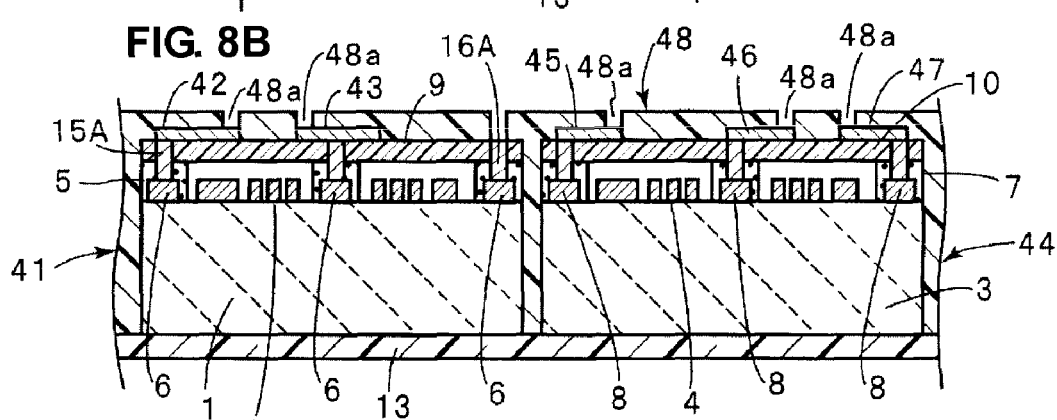

As shown in FIG. 8B, a second insulating layer 48 is formed in substantially the same manner as that described in the first preferred embodiment. The second insulating layer 48 can be formed similarly to the second insulating layer 14 of the first preferred embodiment. Openings 48a are formed such that the inductance-forming wiring patterns 42, 43, and 45 to 47 are exposed therethrough.

Figure 8C:
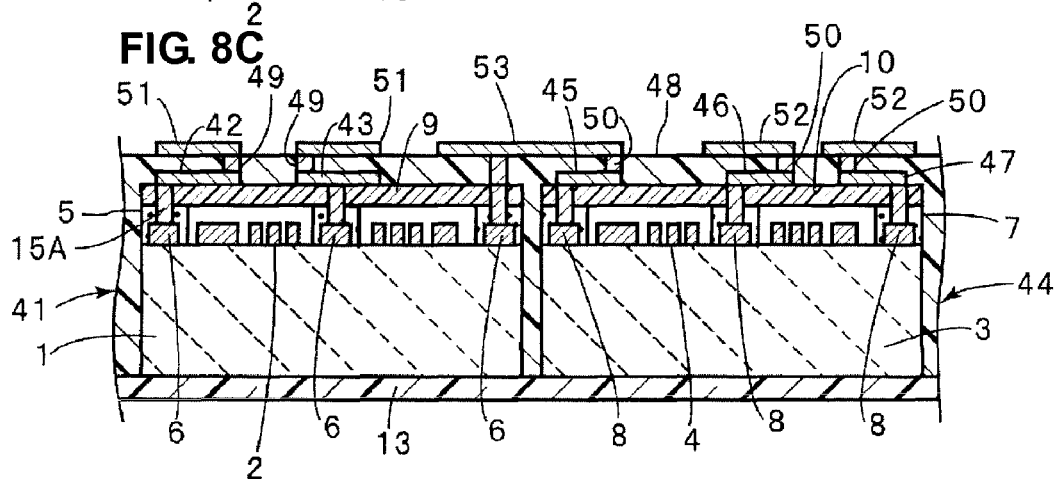

As shown in FIG. 8C, plating films are formed in the openings by electroplating, whereby via-hole conductors 49 and 50 are formed. Inductance-forming wiring patterns 51 to 53 are then formed as shown in FIG. 8C. The inductance-forming wiring patterns 51 to 53 are electrically connected to the via-hole conductors 49 and 50 and form inductance conductors in cooperation with the inductance-forming wiring patterns 42 and 43 or the inductance-forming wiring patterns 45 to 47, the inductance-forming wiring patterns 42, 43, and 45 to 47 being located under the inductance-forming wiring patterns 51 to 53.

Figure 10:
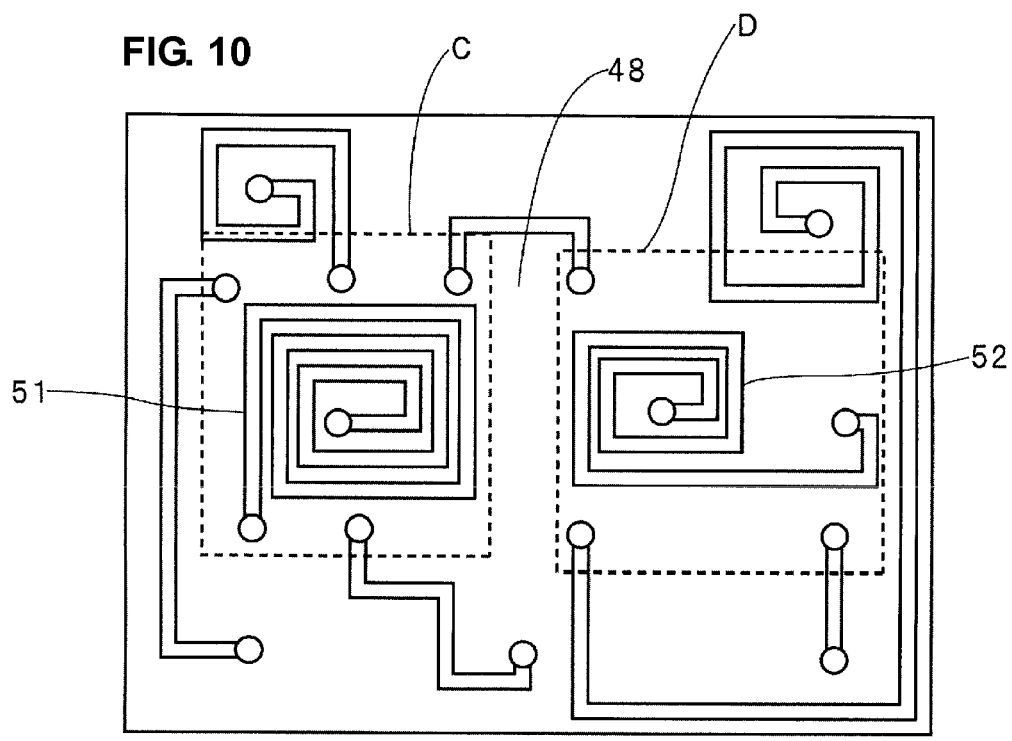
FIG. 10 is a schematic plan view illustrating a state in which an electrode pattern including an inductance wiring pattern is formed on a second insulating layer formed in the second preferred embodiment of the present invention.
Figure 11:
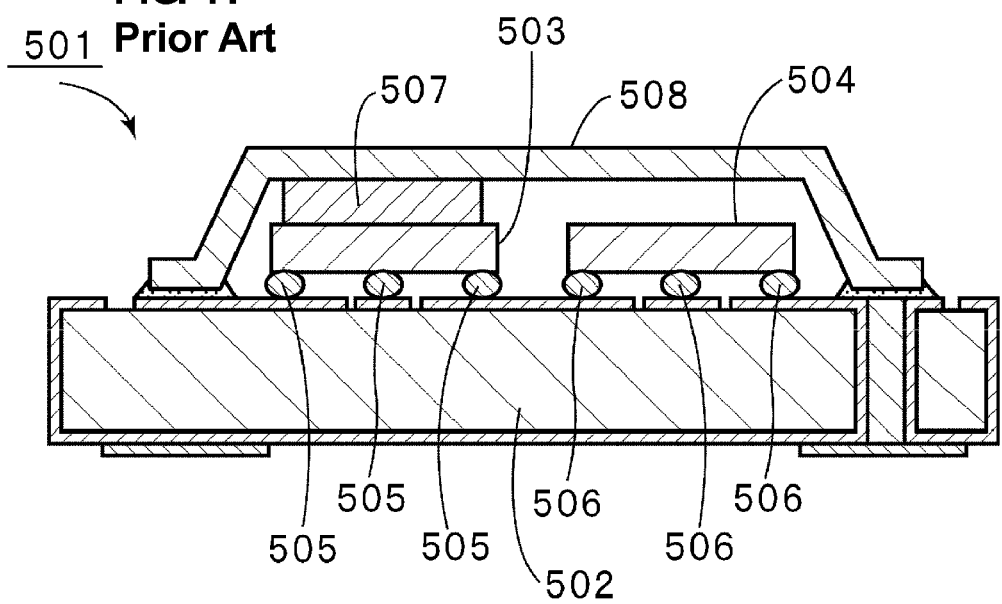
FIG. 11 is a front sectional view of an example of a conventional duplexer.
Figure 12:
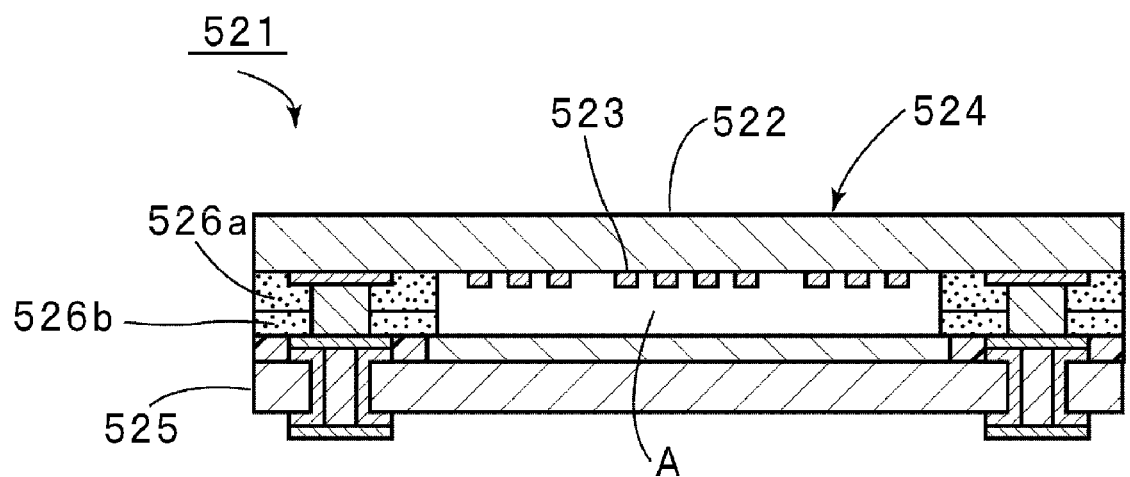
FIG. 12 is a front sectional view of an example of a conventional surface acoustic wave device.

FIG. 10 is a schematic plan view of a wiring pattern which includes inductance wiring patterns 49 and 50 shown in FIG. 8C and which is disposed on the second insulating layer 48. Broken lines C and D in FIG. 10 schematically indicate the position of the transmitting filter chip 41 and the position of the receiving filter chip 44, respectively.

Figure 9A:
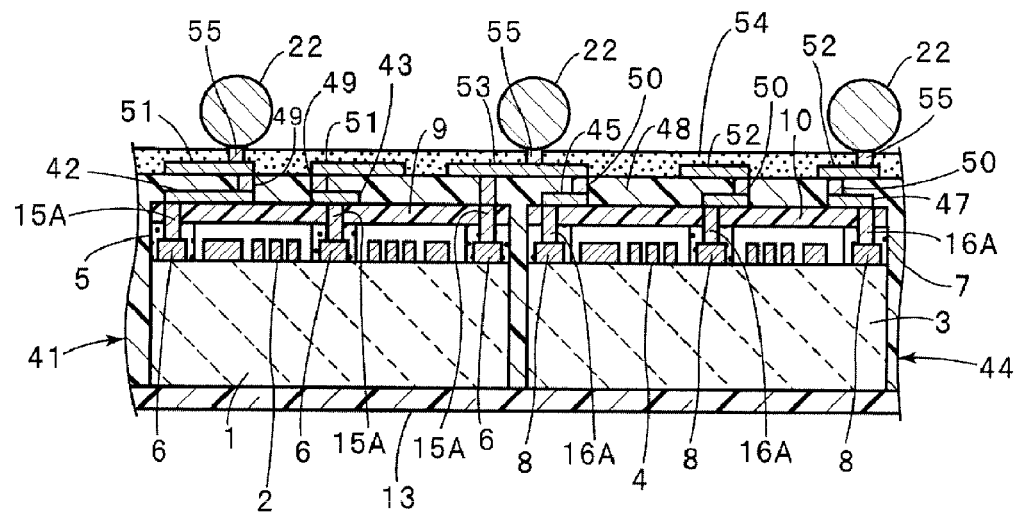
FIG. 9A is a schematic front sectional view of a branching filter obtained in the second preferred embodiment and FIG. 9B is a schematic front sectional view of a modification thereof.

As shown in FIG. 9A, a third insulating layer 54 is formed on the second insulating layer 48. Under-bump metal layers are formed in openings in the third insulating layer 54. Solder balls 22 are then formed in the same manner as that described in the first preferred embodiment. Subsequent steps are the same as those described in the first preferred embodiment. In this preferred embodiment, a branching filter with a reduced size, particularly a reduced height, can be obtained.

In the second preferred embodiment, the solder balls 22, which define external terminals, are electrically connected to the electrode pads 6 or 8 through conductors including the conductors 15A, the inductance-forming wiring patterns 42, the conductors 49, the inductance-forming wiring patterns 51, and the under-bump metal layers 55. The conductors 15A, the inductance-forming wiring patterns 42, and the conductors 49 are conductive portions located in the first or second insulating layer 9 or 48. In the receiving filter chip 44, the conductors 16A, the inductance-forming wiring patterns 47, and the conductors 50 are conductive portions located in the first or second insulating layer 10 or 48.

Figure 9B:
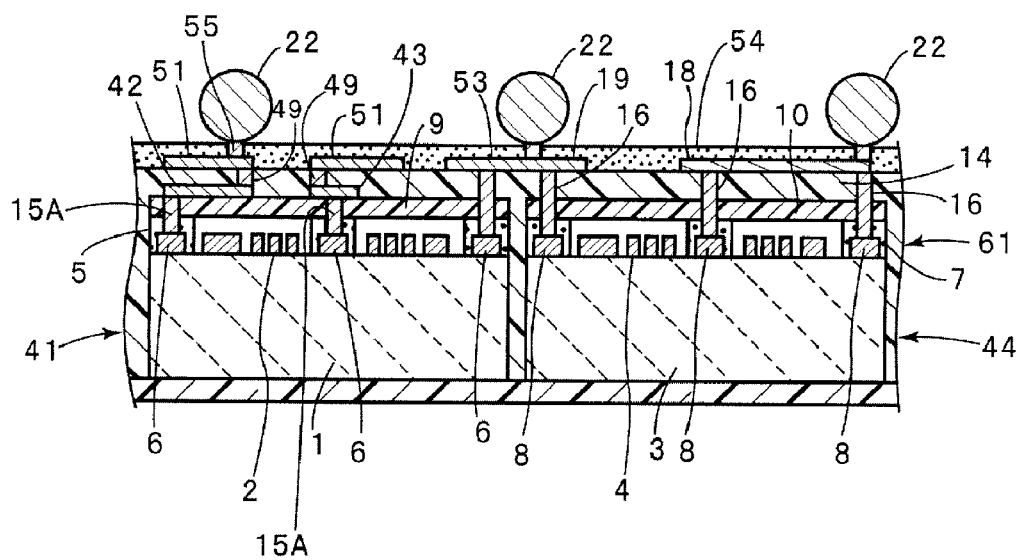

In the second preferred embodiment, the transmitting filter chip 41 and the receiving filter chip 44 each have an inductance. The following structure may be configured: a structure in which a transmitting filter chip 41 has an inductance-forming wiring pattern but a receiving filter chip 61, as well as that described in the first preferred embodiment, has no inductance as shown in FIG. 9B.

That is, one of the receiving filter chip and the transmitting filter chip may contain an inductance conductor.

In each of the first and second preferred embodiments and the modification, the first piezoelectric substrate 1 disposed in the transmitting filter chip and the second piezoelectric substrate 3 disposed in the receiving filter chip are preferably made of different piezoelectric single-crystals. The first and second piezoelectric substrates may be made of piezoelectric single-crystals which are of the same type and which have different cut angles.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A branching filter comprising:
a receiving filter chip; and
a transmitting filter chip, the transmitting filter chip being an acoustic wave filter chip, the receiving filter chip being an acoustic wave filter chip; wherein
the transmitting filter chip includes a first piezoelectric substrate, at least one IDT disposed on an upper surface of the first piezoelectric substrate, and a first insulating layer which extends over the IDT or which is disposed above the IDT;
the receiving filter chip includes a second piezoelectric substrate, at least one IDT disposed on an upper surface of the second piezoelectric substrate, and a first insulating layer which extends over the IDT or which is disposed above the IDT;
the transmitting and receiving filter chips are arranged such that the upper surfaces of the first and second piezoelectric substrates are located upward;
the transmitting and receiving filter chips each include a second insulating layer disposed on a corresponding one of the first insulating layers;
at least one third insulating layer disposed on the upper surface of the second insulating layer;
an external terminal which is disposed on the upper surface of the third insulating layer and which is to be externally electrically connected;
a conductor which has one end connected to the external terminal and another end electrically connected to the IDT and which extends in the first and second insulating layers;
the conductor has a portion which extends in the first and second insulating layers, which is made of metal primarily comprising a plating film; and
the second insulating layer of the transmitting filter chip and the second insulating layer of the receiving filter chip are connected to each other such that the transmitting and receiving filter chips are unified.

2. The branching filter according to claim 1, wherein the second insulating layers extend on side surfaces of the transmitting and receiving filter chips and lower surfaces of the second insulating layers are flush with lower surfaces of the first and second piezoelectric substrates, which are included in the transmitting and receiving filter chips.

3. The branching filter according to claim 1, further comprising inductor conductors disposed in portions in which the second insulating layers and the third insulating layers are stacked and arranged to define inductance components.

4. The branching filter according to claim 1, wherein the receiving or transmitting filter chip is a surface acoustic wave filter chip and further includes a support layer which is disposed on the first piezoelectric substrate and which extends around a region containing the IDT and the first insulating layer is disposed on the upper surface of the support layer such that a space for not preventing vibration is provided.

5. The branching filter according to claim 1, wherein the receiving or transmitting filter chip is a boundary acoustic wave filter chip and the first insulating layer extends above the second piezoelectric substrate so as to cover the IDT.

6. The branching filter according to claim 1, wherein the plating film is made of at least one material selected from the group consisting of Cu, Ni, and an alloy primarily containing these metals.

7. The branching filter according to claim 1, further comprising a protective layer extending over the lower surfaces of the first and second piezoelectric substrates.

8. The branching filter according to claim 7, wherein the protective layer extends over the lower surfaces of the second insulating layers.

9. A method for manufacturing branching filters, comprising:
   a step of preparing transmitting filter chips and receiving filter chips, the transmitting filter chips each including a first piezoelectric substrate, at least one IDT disposed on an upper surface of the first piezoelectric substrate, and a first insulating layer which extends over the IDT or which is disposed above the IDT, the receiving filter chips each including a second piezoelectric substrate, at least one IDT disposed on an upper surface of the second piezoelectric substrate, and a first insulating layer which extends over the IDT or which is disposed above the IDT;
   a step of preparing a carrier substrate;
   a step of pairing the transmitting filter chips with the receiving filter chips and arranging pairs of the transmitting and receiving filter chips on the carrier substrate in a grid pattern in such a manner that lower surfaces of the first and second piezoelectric substrates are applied to the carrier substrate;
   a step of forming a second insulating layer over the upper surfaces of the transmitting and receiving filter chips;
   a step of forming a plurality of through-holes in the second insulating layer;
   a step of forming plating films made of metal in the through-holes by electroplating;
   a step of forming a wiring pattern primarily including a plating film on the upper surface of the second insulating layer by electroplating;
   a step of forming a third insulating layer on the upper surface of the second insulating layer;
   a step of forming a plurality of through-holes in the third insulating layer;
   a step of forming via-hole conductors in such a manner that plating films are formed in the through-holes in the third insulating layer by electroplating;
   a step of forming external terminals on the third insulating layer such that the external terminals are connected to the via-hole conductors;
   a step of dividing the transmitting filter chip-receiving filter chip pairs into the branching filters; and
   a step of removing the transmitting filter chip-receiving filter chip pairs from the carrier substrate.

* * * * *